United States Patent
Naito et al.

(10) Patent No.: US 7,591,409 B2
(45) Date of Patent: Sep. 22, 2009

(54) SEMICONDUCTOR DEVICE BONDING APPARATUS AND METHOD FOR BONDING SEMICONDUCTOR DEVICE USING THE SAME

(75) Inventors: Hiroyuki Naito, Osaka (JP); Satoshi Shida, Osaka (JP); Yasuharu Ueno, Osaka (JP); Makoto Morikawa, Nara (JP)

(73) Assignee: Panasonic Corporation, Osaka (JP)

(*) Notice: Subject to any disclaimer, the term of this patent is extended or adjusted under 35 U.S.C. 154(b) by 122 days.

(21) Appl. No.: 11/815,623

(22) PCT Filed: Jun. 7, 2006

(86) PCT No.: PCT/JP2006/311894

§ 371 (c)(1),
(2), (4) Date: Aug. 6, 2007

(87) PCT Pub. No.: WO2006/134953

PCT Pub. Date: Dec. 21, 2006

(65) Prior Publication Data

US 2009/0020586 A1     Jan. 22, 2009

(30) Foreign Application Priority Data

Jun. 13, 2005   (JP) .............................. 2005-172560

(51) Int. Cl.
*B23K 1/06* (2006.01)
*B23K 37/00* (2006.01)

(52) U.S. Cl. ............................ 228/103; 228/1.1; 228/9; 228/110.1

(58) Field of Classification Search ................. 228/102, 228/110.1; 438/222, 120; 156/378
See application file for complete search history.

(56) References Cited

U.S. PATENT DOCUMENTS

| | | | | |
|---|---|---|---|---|
| 4,746,051 | A | | 5/1988 | Peter |
| 4,806,193 | A | | 2/1989 | Von Raben et al. |
| 5,314,105 | A | * | 5/1994 | Farassat ...................... 228/102 |
| 5,433,369 | A | * | 7/1995 | Okumura .................. 228/110.1 |
| 5,985,064 | A | * | 11/1999 | Sato ............................ 156/64 |
| 6,105,848 | A | * | 8/2000 | Horibe et al. ............. 228/110.1 |
| 6,439,447 | B1 | * | 8/2002 | Minamitani et al. ......... 228/104 |
| 6,543,668 | B1 | * | 4/2003 | Fujii et al. .................. 228/103 |

(Continued)

FOREIGN PATENT DOCUMENTS

JP       61-237439       10/1986

(Continued)

*Primary Examiner*—Kiley Stoner
(74) *Attorney, Agent, or Firm*—Hamre, Schumann, Mueller & Larson, P.C.

(57) ABSTRACT

The semiconductor device bonding apparatus 1 of the present invention includes: a pressing member 15 that presses the semiconductor device 10 toward the substrate 11 side in a state where a bump 14 is provided between the semiconductor device 10 and the substrate 11; an ultrasonic vibration applying member 16 that vibrates the semiconductor device 10 and the substrate 11 relatively by applying an ultrasonic vibration to at least one of the semiconductor device 10 and the substrate 11; a time measuring member 17 that measures a required time period from a time when starting to apply the ultrasonic vibration to a time when the semiconductor device 10 is pressed a predetermined distance; and a controlling member 18 that controls an output of an ultrasonic vibration during subsequent bonding, based on the time period measured by the time measuring member 17.

2 Claims, 3 Drawing Sheets

U.S. PATENT DOCUMENTS

| | | | |
|---|---|---|---|
| 7,219,419 B2 * | 5/2007 | Higashi et al. | 29/740 |
| 2003/0029543 A1 * | 2/2003 | Gotoh et al. | 156/73.1 |
| 2005/0023327 A1 * | 2/2005 | Pendse | 228/180.22 |
| 2005/0098610 A1 * | 5/2005 | Onobori et al. | 228/180.21 |
| 2005/0227429 A1 | 10/2005 | Minamitani et al. | |

FOREIGN PATENT DOCUMENTS

| | | | |
|---|---|---|---|
| JP | 11097493 A * | 4/1999 | |
| JP | 11297761 A * | 10/1999 | |
| JP | 2002-313837 | 10/2002 | |
| JP | 2006269539 A * | 10/2006 | |
| WO | WO 2006/134953 A1 * | 12/2006 | |

* cited by examiner

SEMICONDUCTOR DEVICE BONDING APPARATUS AND METHOD FOR BONDING SEMICONDUCTOR DEVICE USING THE SAME

TECHNICAL FIELD

The present invention relates to a semiconductor device bonding apparatus that repeats operations for bonding a semiconductor device and a substrate, and a method for bonding a semiconductor device using the semiconductor device bonding apparatus.

BACKGROUND ART

As an apparatus for bonding a semiconductor device onto a substrate, a semiconductor device bonding apparatus for bonding a semiconductor device and a substrate while vibrating them relatively with an ultrasonic vibration, in a state where a bump is provided between the semiconductor device and the substrate, is known.

If bonding operations are repeated by using a conventional semiconductor device bonding apparatus, a bonding strength (for example, a shear strength) may be decreased by, for example, a contamination of a holding member of a semiconductor device or a contamination of a stage on which a substrate is mounted. In order to solve the above-described problem, a semiconductor device bonding apparatus including a judging device that judges the presence or absence of the contamination of the holding member by detecting a change of a relative vibration between a semiconductor device and a substrate is suggested in JP 2002-313837 A.

However, there is no specific correlation between the presence or absence of the contamination of the holding member and the shear strength, and thus the semiconductor device bonding apparatus suggested in JP 2002-313837 A is not sufficient for maintaining the shear strength at a predetermined value or more.

DISCLOSURE OF INVENTION

The present invention provides a semiconductor device bonding apparatus that can maintain a shear strength at a predetermined value or more, and a method for bonding a semiconductor device using the semiconductor device bonding apparatus.

The semiconductor device bonding apparatus of the present invention is a semiconductor device bonding apparatus that repeats operations for bonding a semiconductor device and a substrate, the semiconductor device bonding apparatus including: a pressing member that presses the semiconductor device toward the substrate side in a state where a bump is provided between the semiconductor device and the substrate; an ultrasonic vibration applying member that vibrates the semiconductor device and the substrate relatively by applying an ultrasonic vibration to at least one of the semiconductor device and the substrate; a time measuring member that measures a required time period from a time when starting to apply the ultrasonic vibration to a time when the semiconductor device is pressed a predetermined distance; and a controlling member that controls an output of an ultrasonic vibration during subsequent bonding, based on the time period measured by the time measuring member.

The method for bonding a semiconductor device of the present invention is a method for bonding a semiconductor device in which operations for bonding a semiconductor device and a substrate are performed repeatedly, the method including: vibrating the semiconductor device and the substrate relatively by applying an ultrasonic vibration to at least one of the semiconductor device and the substrate, while pressing the semiconductor device toward the substrate side, in a state where a bump is provided between the semiconductor device and the substrate; measuring a required time period from a time when starting to apply the ultrasonic vibration to a time when the semiconductor device is pressed a predetermined distance; and controlling an output of an ultrasonic vibration during subsequent bonding, based on the measured time period.

DESCRIPTION OF THE INVENTION

Figure 1:
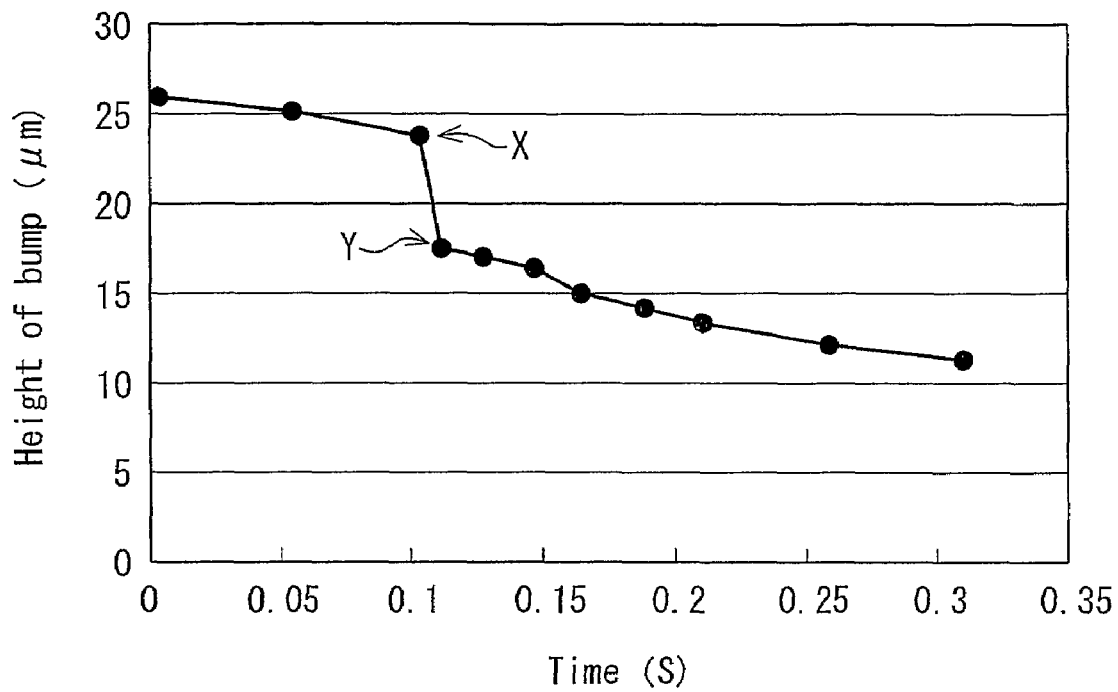
FIG. 1 is a graph showing a change of a height of a bump with time during bonding.

The semiconductor device bonding apparatus of the present invention is used as a semiconductor device bonding apparatus that repeats operations for bonding a semiconductor device and a substrate. The semiconductor device is not limited particularly, and for example, a semiconductor chip (so-called bare chip) that is obtained by cutting a semiconductor wafer and the like can be used. The substrate also is not limited particularly, and for example, a glass epoxy substrate, a ceramic substrate and the like can be used.

Moreover, the semiconductor device bonding apparatus of the present invention includes: a pressing member that presses the semiconductor device toward the substrate side in a state where a bump is provided between the semiconductor device and the substrate; and an ultrasonic vibration applying member that vibrates the semiconductor device and the substrate relatively by applying an ultrasonic vibration to at least one of the semiconductor device and the substrate.

The bump is provided, in advance, on an electrode that is formed in the semiconductor device or on an electrode that is formed on the substrate, for example, before the bonding. A shape of the bump is not limited particularly, as long as a height of the bump before the bonding ranges, for example, from about 20 µm to about 30 µm, a volume of the bump before the bonding ranges, for example, from about $7 \times 10^4$ µm$^3$ to about $10 \times 10^4$ µm$^3$, and an area of a bonding part of the bump before the bonding ranges, for example, from about $3 \times 10^3$ µm$^2$ to about $5 \times 10^3$ µm$^2$. Moreover, a material of the bump also is not limited particularly, and for example, a metal material such as gold can be used.

The pressing member is not limited particularly, and for example, a motive power such as a voice coil motor (hereinafter, abbreviated as "VCM") and the like can be used. A load applied for pressing the semiconductor device by the pressing member ranges, for example, from about 500 mN to about 1000 mN per one bump. In the below description, a value of the load applied for pressing the semiconductor device denotes a value of a load per one bump.

The ultrasonic vibration applying member also is not limited particularly, and for example, a conventional ultrasonic vibration generating device can be used. A frequency of the ultrasonic vibration applied by the ultrasonic vibration applying member may range, for example, from about 60 kHz to about 120 kHz, and an output thereof may range, for example, from about 0.25 W to about 2.5 W. A vibrating direction of the ultrasonic vibration is not limited particularly, as long as it is parallel with a surface of the substrate. Moreover, the application of the ultrasonic vibration may be performed, for example, either by applying the ultrasonic vibration to the semiconductor device in a state of fixing the substrate, or by applying the ultrasonic vibration to the substrate in a state of fixing the semiconductor device, as long as the semiconductor device and the substrate can be vibrated relatively. Alternatively, ultrasonic vibrations having different phases may be applied to the substrate and the semiconductor device, respectively.

When the ultrasonic vibration is applied to at least one of the semiconductor device and the substrate by the ultrasonic vibration applying member, while pressing the semiconductor device by the pressing member, a deformation distance (compression distance) of the bump is increased significantly. Thereby, a pressed distance of the semiconductor device that is pressed toward the substrate side is increased significantly.

FIG. 1 shows a change of the height of the bump with time during the bonding. In the example shown in FIG. 1, a gold bump was used as the bump, a height and a volume of the bump before the bonding were 26 μm and $8 \times 10^4$ μm$^3$, respectively, and an area of a bonding part of the bump before the bonding was $3.8 \times 10^3$ μm$^2$. Moreover, a load applied for pressing the semiconductor device was 2300 mN, and a frequency and an output of the ultrasonic vibration to be applied were 63.5 kHz and 1.5 W, respectively. As shown in FIG. 1, from a time X when starting to apply the ultrasonic vibration to a time Y when the semiconductor device is pressed a predetermined distance, the height of the bump was decreased significantly. That is, in an initial stage of the application of the ultrasonic vibration, a pressing speed of the semiconductor device toward the substrate side was increased. The inventors of the present invention have found a correlation between the pressing speed of the semiconductor device toward the substrate side in the initial stage of the application of the ultrasonic vibration (hereinafter, simply called a "pressing speed") and a shear strength that is an indicator of a bonding strength, thereby reaching the present invention.

Figure 2:
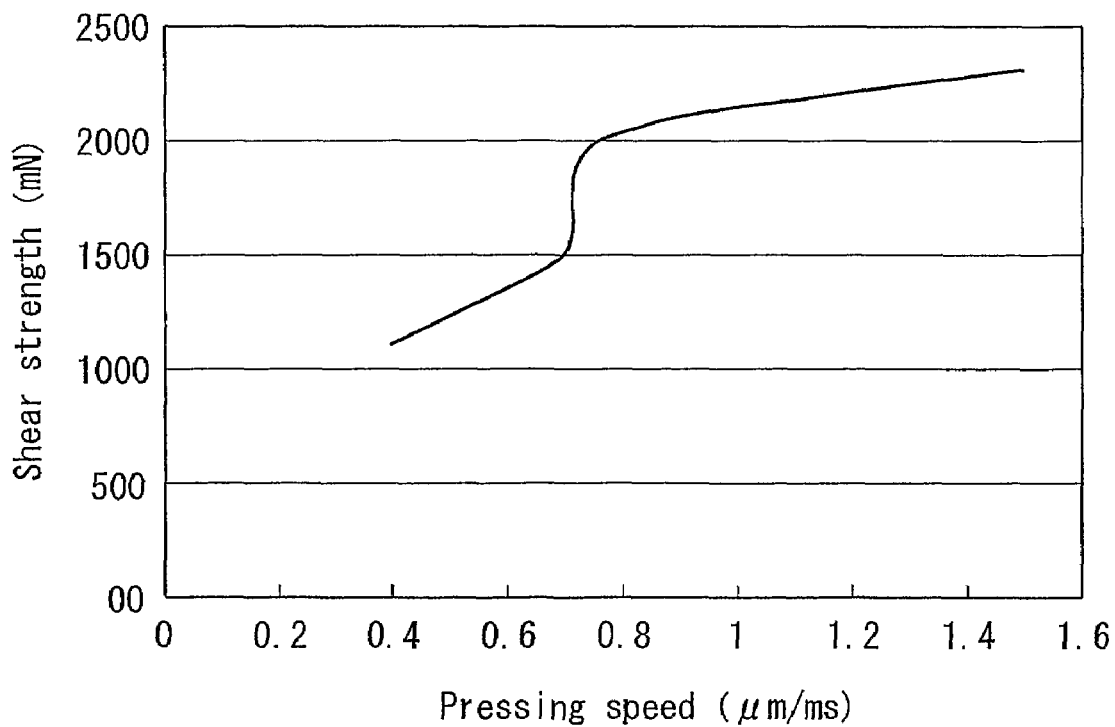
FIG. 2 is a graph showing a relationship between a pressing speed and a shear strength.

The above-described correlation will be described with reference to FIG. 2. FIG. 2 is a graph showing a relationship between the pressing speed and the shear strength per one bump (hereinafter, a value of the shear strength denotes a value of the shear strength per one bump). Herein, the pressing speed in this case denotes an average speed from the time when starting to apply the ultrasonic vibration to a time when the semiconductor device is pressed 7 μm. That is, the pressing speed denotes a speed that is obtained by calculating 7/T, where T (expressed as "ms") denotes a time period required for pressing the semiconductor device 7 μm. Moreover, the bump used was similar to the bump used in the example shown in FIG. 1, and the shear strength was measured by performing a land pull shear test using PTR-3000 manufactured by Rhesca Co., Ltd.

As shown in FIG. 2, the pressing speed and the shear strength have a favorable correlation. Thus, it can be found that the pressing speed is required to be 0.78 μm/ms or more, for obtaining the shear strength of 2000 mN or more in a system shown in FIG. 2, for example.

Considering the above-described results, the semiconductor device bonding apparatus of the present invention includes: a time measuring member that measures a required time period from a time when starting to apply the ultrasonic vibration to a time when the semiconductor device is pressed a predetermined distance; and a controlling member that controls an output of an ultrasonic vibration during subsequent bonding based on the time period measured by the time measuring member so that the time period in the subsequent bonding may be in a predetermined range, in addition to the above-described components. Herein, the above-described "predetermined distance" is a pressed distance when the pressing speed is increased in the initial stage of the application of the ultrasonic vibration, and the value thereof differs depending on the used bump and the like, and may range, for example, from about 5 μm to about 7 μm.

The semiconductor device bonding apparatus of the present invention can maintain the shear strength at a predetermined value or more, because of the above-described components. For example, in the case where, as a result of performing the bonding operations n times (n is a natural number) by using the semiconductor device bonding apparatus of the present invention, the time period required for pressing the predetermined distance of the semiconductor device is increased (that is, in the case where the pressing speed of the semiconductor device is decreased), the pressing speed may be maintained at a predetermined value or more, by increasing an output of the ultrasonic vibration in a (n+1)th bonding operation by a predetermined distance from an output thereof in a nth bonding operation, by using the controlling member. Thereby, the shear strength can be maintained at the predetermined value or more. Herein, the increased distance of the output of the ultrasonic vibration differs depending on the required shear strength, the used bump and the like, and a preferred example thereof will be described below.

The time measuring member is not limited particularly, and a counter or the like that can measure a time period ranging, for example, from about 3 ms to about 10 ms is preferable. The controlling member may include, for example, a central processing unit (CPU) or the like that is used in a computer.

Next, the method for bonding a semiconductor device of the present invention will be described. Herein, the method for bonding a semiconductor device of the present invention is a method for bonding a semiconductor device using the above-described semiconductor device bonding apparatus of the present invention. Therefore, in the below description, explanations of the contents that are overlapped with the above description may be omitted.

The method for bonding a semiconductor device of the present invention is a method for bonding a semiconductor device in which operations for bonding a semiconductor device and a substrate are performed repeatedly, the method including: vibrating the semiconductor device and the substrate relatively by applying an ultrasonic vibration to at least one of the semiconductor device and the substrate, while pressing the semiconductor device toward the substrate side, in a state where a bump is provided between the semiconductor device and the substrate; measuring a required time period from a time when starting to apply the ultrasonic vibration to a time when the semiconductor device is pressed a predetermined distance; and controlling an output of an ultrasonic vibration during subsequent bonding, based on the measured time period. Thereby, the pressing speed of the semiconductor device can be maintained at the predetermined value or more as mentioned above, and thus the shear strength can be maintained at the predetermined value or more. The embodiment of the present invention will be described blow in detail.

Figure 3:
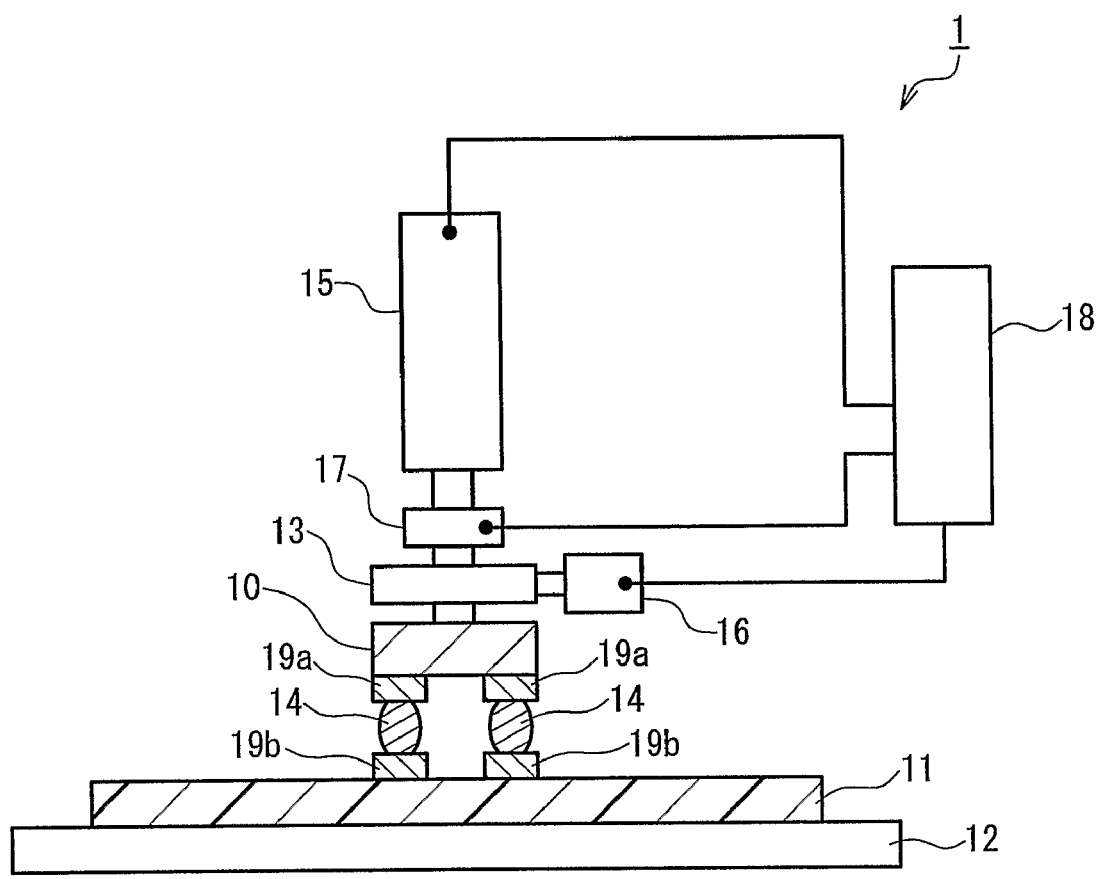
FIG. 3 is a diagram schematically showing a configuration of a semiconductor device bonding apparatus according to an embodiment of the present invention.

Firstly, a semiconductor device bonding apparatus according to an embodiment of the present invention will be described with reference to drawings. FIG. 3 to be referenced is a diagram schematically showing a configuration of the semiconductor device bonding apparatus according to the embodiment of the present invention.

As shown in FIG. 3, a semiconductor device bonding apparatus 1 according to the embodiment of the present invention is a semiconductor device bonding apparatus that repeats operations for bonding a semiconductor device 10 and a substrate 11, which includes: a stage 12 on which a substrate 11 is mounted; a holding member 13 that holds the semiconductor device 10; a VCM 15 that presses the semiconductor device 10 toward the substrate 11 side in a state where a bump 14 is provided between the semiconductor device 10 and the substrate 11; an ultrasonic vibration applying member 16 that vibrates the semiconductor device 10 and the substrate 11 relatively by applying an ultrasonic vibration to the semiconductor device 10 via the holding member 13; a load cell 17 that detects a load applied to the semiconductor device 10; and a controlling member 18 that controls the respective components of the semiconductor device bonding apparatus 1.

The bump 14 is provided in advance on an electrode 19a that is formed on the semiconductor device 10 before bonding. And, when the load is applied onto the semiconductor device 10 by the VCM 15, the bump 14 is compressed in a state of being in contact with an electrode 19b that is formed on the substrate 11. Thereby, the semiconductor device 10 is pressed toward the substrate 11 side. Moreover, by applying the ultrasonic vibration to the semiconductor device 10 by using the ultrasonic vibration applying member 16, the semiconductor device 10 and the substrate 11 are vibrated relatively. Thereby, the bump 14 is softened, and the semiconductor device 10 and the substrate 11 are bonded via the bump 14.

The load cell 17 also can function as a time measuring member that measures a required time period from a time when starting to apply the ultrasonic vibration to the semiconductor device 10 to a time when the semiconductor device 10 is pressed a predetermined distance. For allowing the load cell 17 to start the time measurement, for example, the load cell 17 detects a significant change of a pressed distance of the semiconductor device 10 at a moment when starting to apply the ultrasonic vibration, and starts the time measurement at this moment. Alternatively, it is also possible that, at the moment when starting to apply the ultrasonic vibration to the semiconductor device 10, the controlling member 18 transmits a signal for starting the time measurement to the load cell 17. Similarly, in the case of allowing the load cell 17 to terminate the time measurement, for example, at the time when the semiconductor device 10 is pressed the predetermined distance by the VCM 15, the controlling member 18 may transmit a signal for terminating the time measurement to the load cell 17. And, based on the time period measured by the load cell 17, the controlling member 18 controls an output of the ultrasonic vibration during subsequent bonding. Thereby, a pressing speed of the semiconductor device 10 can be maintained at a predetermined value or more, and thus a shear strength can be maintained at a predetermined value or more.

The semiconductor device bonding apparatus according to the embodiment of the present invention was described above, but the present invention is not limited to this. For example, the load cell 17 was used as the time measuring member in the above-described embodiment, but the time measuring member is not limited to this, and for example, the controlling member 18 may function also as the time measuring member.

Figure 4:
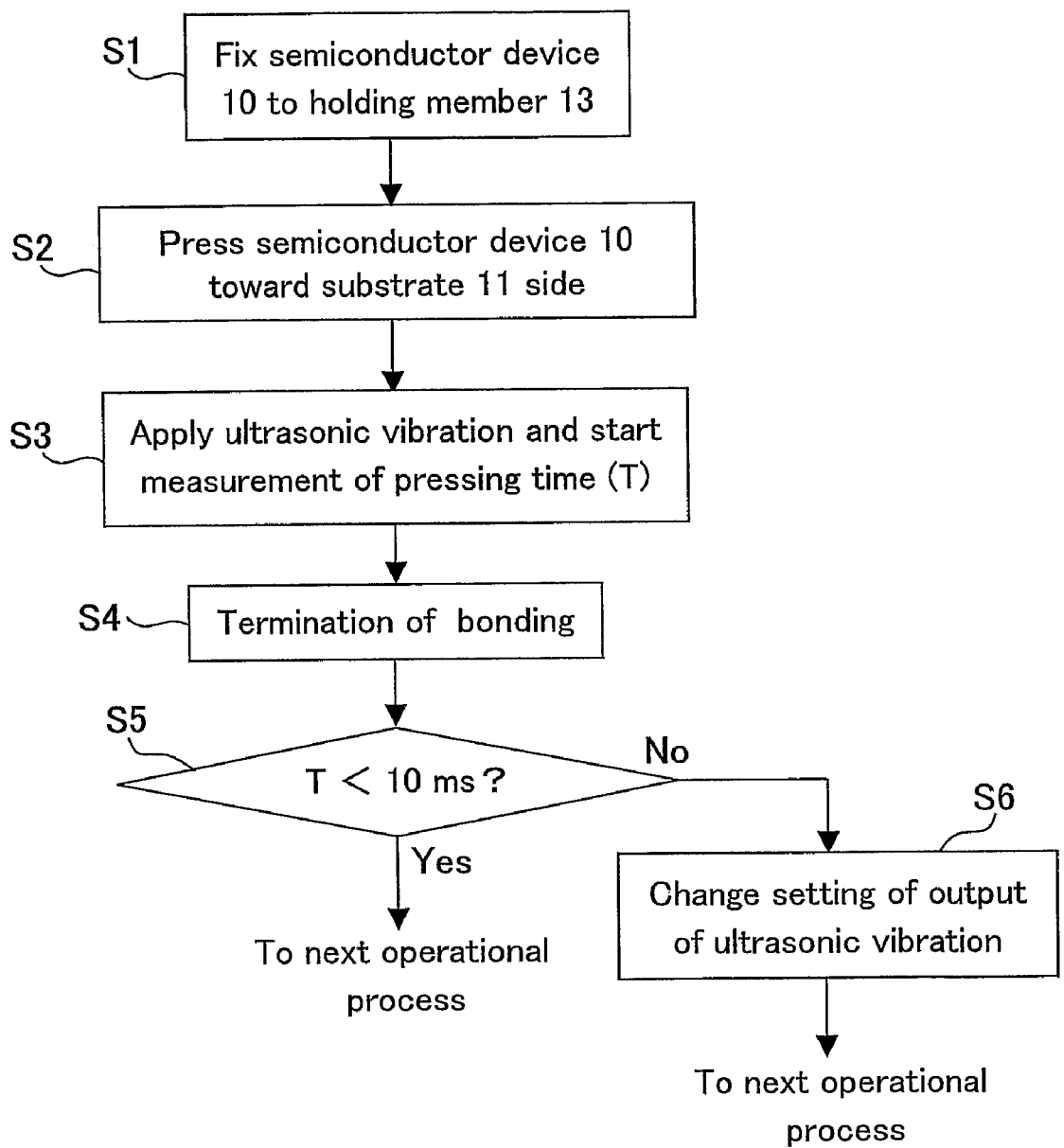
FIG. 4 is a flowchart showing a method for bonding a semiconductor device according to an embodiment of the present invention.

Next, a method for bonding a semiconductor device according to an embodiment of the present invention will be described with reference to FIGS. 3 and 4. FIG. 4 is a flowchart showing the method for bonding a semiconductor device according to the embodiment of the present invention. The below-described method for bonding a semiconductor device is a method for bonding a semiconductor device using the semiconductor device bonding apparatus 1 according to the above-described embodiment of the present invention. In the below description, the same components as those in FIG. 3 are denoted with the same reference numerals as those therein, and the explanations thereof will be omitted.

Firstly, the semiconductor device 10 is fixed to the holding member 13 (Step S1). Next, the semiconductor device 10 is pressed toward the substrate 11 side by the VCM 15 in a state where the bump 14 is provided between the semiconductor device 10 and the substrate 11 (Step S2). Subsequently, when the load cell 17 detects a predetermined load (ranging, for example, from about 50 mN to about 500 mN), the ultrasonic vibration applying member 16 applies the ultrasonic vibration to the semiconductor device 10, and the load cell 17 starts measurement of a pressing time (T) (Step S3). This pressing time (T) is a time period from the time when starting to apply the ultrasonic vibration to a time when, for example, the semiconductor device 10 is pressed 5 μm to 7 μm.

Then, from the time when the load cell 17 detects the predetermined load to a time when, for example, the semiconductor device 10 is pressed 10 μm to 15 μm, the holding member 13 releases the semiconductor device 10 so as to terminate the bonding operation (Step S4).

Then, the controlling member 18 judges whether the pressing time (T) is less than 10 ms or not (Step S5), and in the case where the pressing time is less than 10 ms ("Yes" in Step S5), a subsequent bonding operation is performed without changing the setting of the output of the ultrasonic vibration. On the other hand, in the case where the pressing time is 10 ms or more ("No" in Step S5), the setting of the output of the ultrasonic vibration is changed by the controlling member 18 (Step S6), and then the subsequent bonding operation is performed. Thereby, the pressing speed of the semiconductor device 10 can be maintained at the predetermined value or more, and thus the shear strength can be maintained at the predetermined value or more.

The method for bonding a semiconductor device according to the embodiment of the present invention was described above, but the present invention is not limited to this. For example, in the above-described embodiment, the output of the ultrasonic vibration was changed in the case where the pressing time (T) was 10 ms or more, but the set value is not limited to this in the present invention, and may be determined appropriately in accordance with the required shear strength.

EXAMPLE

An example of the present invention will be described below. The present invention is not limited to this example.

Table 1 shows transitions of respective conditions while repeating bonding operations by using the above-described semiconductor device bonding apparatus 1. Herein, a pressing time in Table 1 denotes a time period from a time when starting to apply an ultrasonic vibration to a time when the semiconductor device 10 was pressed 6 μm. Moreover, in the example shown in Table 1, the controlling member 18 was set to increase a setting of an output of the ultrasonic vibration by 0.5 W, when the pressing time became 10 ms or more. In addition, in the example shown in Table 1, a gold bump was used as the bump 14, a height and a volume of the bump 14 before bonding were 26 µm and $8 \times 10^4$ µm$^3$, respectively, and an area of a bonding part of the bump 14 before the bonding was $3.8 \times 10^3$ µm$^2$. Moreover, a load applied for pressing the semiconductor device 10 was 2500 mN, and a frequency of the ultrasonic vibration to be applied was 63.5 kHz.

TABLE 1

| Number of bonding operations (times) | Pressing time (ms) | Output of ultrasonic vibration (W) | Shear strength (mN) |
|---|---|---|---|
| 1 | 3 | 1.5 | 2200 |
| 2 | 3 | 1.5 | 2200 |
| 3 | 3 | 1.5 | 2200 |
| 4 | 3 | 1.5 | 2200 |
| . | . | . | . |
| . | . | . | . |
| . | . | . | . |
| 600 | 10 | 1.5 | 1300 |
| 601 | 4 | 2.0 | 2100 |

As shown in Table 1, the pressing time immediately after the starting of the bonding (from the first bonding operation to the fourth bonding operation) was 3 ms, but gradually became larger as repeating the bonding operations more (not shown in Table 1), and reached 10 ms in the 600th bonding operation. According to this, the shear strength in the 600th bonding operation was 1300 mN, which was decreased by 900 mN from the shear strength immediately after the starting. And, since the pressing time reached 10 ms in the 600th bonding operation, the controlling member 18 increased the output of the ultrasonic vibration from 1.5 W to 2.0 W before the 601st bonding operation. As a result, the pressing time became 4 ms in the 601st bonding operation, and the shear strength was stored to 2100 mN.

In the above-described example, the output of the ultrasonic vibration was set to be increased by 0.5 W when the pressing time became 10 ms or more, and thus, for example, in the case where a lower limit value of the required shear strength was 1200 mN, the shear strength usually could be maintained at this lower limit value or more. In the above-described example, the output of the ultrasonic vibration was set to be increased by 0.5 W when the pressing time became 10 ms or more, but the set value is not limited to this in the present invention, and may be determined appropriately in accordance with the required shear strength.

INDUSTRIAL APPLICABILITY

The present invention is usefully applied to a semiconductor device bonding apparatus and a method for bonding a semiconductor device that can control a shear strength precisely.

The invention claimed is:

1. A semiconductor device bonding apparatus that repeats operations for bonding a semiconductor device and a substrate, the semiconductor device bonding apparatus comprising:
   a pressing member that presses the semiconductor device toward the substrate side in a state where a bump is provided between the semiconductor device and the substrate;
   an ultrasonic vibration applying member that vibrates the semiconductor device and the substrate relatively by applying an ultrasonic vibration to at least one of the semiconductor device and the substrate;
   a time measuring member that measures a time period from a time when starting to apply the ultrasonic vibration, through a period in which a deformation distance of the bump increases significantly, to a time when a significant deformation of the bump ends; and
   a controlling member that controls an output of an ultrasonic vibration during subsequent bonding, based on the time period measured by the time measuring member.

2. A method for bonding a semiconductor device in which operations for bonding a semiconductor device and a substrate are performed repeatedly, the method comprising:
   vibrating the semiconductor device and the substrate relatively by applying an ultrasonic vibration to at least one of the semiconductor device and the substrate, while pressing the semiconductor device toward the substrate side, in a state where a bump is provided between the semiconductor device and the substrate;
   measuring a time period from a time when starting to apply the ultrasonic vibration, through a period in which a deformation distance of the bump increases significantly, to a time when a significant deformation of the bump ends; and
   controlling an output of an ultrasonic vibration during subsequent bonding, based on the measured time period.

* * * * *